(12) United States Patent
Dono et al.

(10) Patent No.: US 7,742,356 B2
(45) Date of Patent: Jun. 22, 2010

(54) SEMICONDUCTOR MEMORY DEVICE HAVING A REFRESH CYCLE CHANGING CIRCUIT

(75) Inventors: Chiaki Dono, Tokyo (JP); Yasuji Koshikawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 82 days.

(21) Appl. No.: 11/987,767

(22) Filed: Dec. 4, 2007

(65) Prior Publication Data

US 2008/0130394 A1 Jun. 5, 2008

(30) Foreign Application Priority Data

Dec. 5, 2006 (JP) .............................. 2006-328814

(51) Int. Cl.
G11C 7/00 (2006.01)
(52) U.S. Cl. ........................ 365/222; 365/228; 365/229; 365/233.1; 365/185.25; 711/105; 711/106; 714/754
(58) Field of Classification Search ................. 365/222, 365/228, 229, 233.1, 185.25; 711/105, 106; 714/754
See application file for complete search history.

(56) References Cited

U.S. PATENT DOCUMENTS

| | | | | |
|---|---|---|---|---|
| 5,740,119 A | * | 4/1998 | Asakura et al. | 365/222 |
| 5,970,507 A | * | 10/1999 | Kato et al. | 711/106 |
| 5,991,218 A | | 11/1999 | Kushiyama | |
| 6,208,577 B1 | * | 3/2001 | Mullarkey | 365/222 |
| 6,327,208 B1 | * | 12/2001 | Kitade | 365/222 |
| 6,327,210 B1 | * | 12/2001 | Kuroda et al. | 365/222 |
| 2004/0130958 A1 | * | 7/2004 | Takahashi et al. | 365/222 |
| 2006/0176749 A1 | * | 8/2006 | Dono et al. | 365/222 |

FOREIGN PATENT DOCUMENTS

| | | |
|---|---|---|
| JP | 6-84353 | 3/1994 |
| JP | 8-87883 | 4/1996 |
| JP | 11-39861 | 2/1999 |
| JP | 2000-132963 | 5/2000 |
| JP | 2000-298982 | 10/2000 |
| JP | 2002-117671 | 4/2002 |
| JP | 2002-157880 | 5/2002 |
| JP | 2003-68075 | 3/2003 |
| JP | 2005-116106 | 4/2005 |
| JP | 2006-172526 | 6/2006 |

OTHER PUBLICATIONS

Japanese Office Action dated Dec. 2, 2008, with partial English Translation.

* cited by examiner

*Primary Examiner*—VanThu Nguyen
*Assistant Examiner*—Eric Wendler
(74) *Attorney, Agent, or Firm*—McGinn IP Law Group PLLC

(57) ABSTRACT

A semiconductor memory device includes a first refresh cycle changing circuit that changes a refresh cycle according to an auto-refresh mode, without giving influence to a refresh cycle according to a self-refresh mode, and a second refresh cycle changing circuit that changes a refresh cycle according to the self-refresh mode, without giving influence to a refresh cycle according to the auto-refresh mode. In this way, according to the present invention, the refresh cycle according to the auto-refresh mode and the refresh cycle according to the self-refresh mode can be controlled independently. Therefore, refresh operation considering the characteristic of each mode can be executed.

8 Claims, 12 Drawing Sheets

| REFRESH CYCLE SET SIGNAL | | REFRESH CYCLE | | IMPROVEMENT IN IMFORMATION HOLDING CHARACTERISTIC | THE NUMBER OF MEMORY CELLS REQUIRING REFRESH-RELIEF | POWER CONSUMPTION |
|---|---|---|---|---|---|---|
| RC1 | RC2 | AUTO-REFRESH | SELF-REFRESH | | | |
| H | H | $t_{REF}/2$ | $t_{REF}/2$ | HIGH ← | LARGE ← | LARGE ← |
| H | L | $t_{REF}/2$ | $t_{REF}$ | | | |
| L | L | $t_{REF}$ | $t_{REF}$ | | | |

SEMICONDUCTOR MEMORY DEVICE HAVING A REFRESH CYCLE CHANGING CIRCUIT

TECHNICAL FIELD

The present invention relates to a semiconductor memory device, and, more particularly to a semiconductor memory device requiring a refresh operation like a DRAM (Dynamic Random Access Memory).

BACKGROUND OF THE INVENTION

Among various semiconductor memory devices, a DRAM is one of the semiconductor memory devices most suitable for a large density, and is widely used for a main memory and the like of a computer. A prime reason that the DRAM is excellent for a large density is that a memory configuration of the DRAM is remarkably simple as compared with those of other semiconductor memory devices. In other words, each of memory cells of the DRAM includes one capacitor and one MOS transistor, and stores information based on a charge amount stored in the capacitor. Charging to and discharging from the capacitor are controlled by the MOS transistor connected to word lines. When the MOS transistor is turned on, a storage node of the capacitor is connected to a corresponding bit line, thereby making it possible to read or write the information.

Because the memory cells of the DRAM store information based on the charge amount stored in the capacitor as described above, the stored information is disappeared by a leak current, unless a refresh operation is executed periodically. Therefore, all memory cells need to be refreshed before the information disappears due to the leak current. A refresh cycle $t_{REF}$ of refreshing all memory cells is prescribed as 64 milliseconds, for example, by a standard. This means that time equal to or larger than $t_{REF}$ is required as information holding time of each memory cell. Accordingly, a memory cell of which information holding time is shorter than $t_{REF}$ is a "refresh defective cell", and the address corresponding to the refresh defective cell is treated as a "refresh defective address". Usually, the refresh defective address is relieved by replacing the refresh defective cell with a redundant memory cell, and the cell is shipped as a normal chip.

However, along with the progress of miniaturization and a capacity increase, the number of refresh defective cells contained in one chip becomes very large. Therefore, in recent years, the number of redundant memory cells to be prepared for one chip and the number of fuse elements (ROM) to store defective addresses have become very large, and this interrupts the capacity increase.

In order to solve these problems, instead of replacing all refresh defective cells with redundant memory cells, it is considered suitable to relieve the refresh defective addresses by increasing the execution frequency of the refresh operation for the refresh defective cells of which information holding time is slightly shorter than $t_{REF}$. For example, for the refresh defective cells having information holding time shorter than $t_{REF}$ (for example, 64 msec) and equal to or longer than $t_{REF}/2$ (for example, 32 msec), the refresh defective addresses can be relieved by increasing the execution frequency of the refresh operation to two times, without replacing the refresh defective cells with the redundant memory cells (refresh-relief).

A technique of relieving the refresh defective cells by increasing the execution frequency of the refresh operation of only specific cells is described in Japanese Patent Application Laid-open Nos. 2000-132963 and 2005-116106. According to this (multiple refresh) technique, when an address of which only a part of bits is different from bits of the refresh defective address is given from the refresh counter, word lines corresponding to the refresh defective cells as well as word lines corresponding to the address indicated by the refresh counter are simultaneously activated.

As refresh modes of a DRAM, there are an auto-refresh mode and a self-refresh mode. The former is a mode for executing refresh in response to an external refresh command supplied from the outside. By inserting the auto-refresh mode into between a read operation and a write operation, all memory cells are controlled to be refreshed during the $t_{REF}$ period. On the other hand, the latter is a mode for executing refresh in response to an internal refresh command that is automatically generated in the inside. The self-refresh mode is executed when the DRAM is in a power down state.

Because the auto-refresh is executed during a period while the normal read operation or the write operation is being executed, power consumption of the refresh operation has little problem in the specification. However, a power source voltage easily changes by the execution of the read operation or the write operation. Further, a chip temperature rises due to heat generation by the read operation or the write operation, and there is a possibility that an information holding characteristic of memory cells decreases during the auto-refresh time.

On the other hand, during the self-refresh time, the DRAM is in a power down state, and there is little change in the power source voltage. Because the chip temperature is also stabilized, the information holding characteristic of the memory cells is in a high state. However, because the power consumption permitted in the power down state is very small in the specification, executing a multiple refresh over a wide range has a risk of not satisfying the current standard.

As explained above, when the multiple refresh is executed, the refresh defective cells can be relieved without replacing the refresh defective cells with the redundant memory cells. However when the multiple refresh is performed, power consumption during the self-refresh time becomes the problem.

As a technique of decreasing power consumption during the self-refresh, a method of not carrying out refresh to a part of memory cells during the self-refresh time is proposed as described in Japanese Patent Application Laid-open Nos. 2002-157880, 2000-298982, and 2003-68075. A method of decreasing the power consumption during the self-refresh time by adjusting the cycle of the refresh timer according to the chip temperature is described in Japanese Patent Application Laid-open Nos. 2002-117671 and 2006-172526.

However, the methods described in Japanese Patent Application Laid-open Nos. 2002-157880, 2000-298982, and 2003-68075 are based on the assumption that a part of data is destroyed. Therefore, it is considered that these methods cannot be applied in substantially all cases. The methods described in Japanese Patent Application Laid-open Nos. 2002-117671 and 2006-172526 can decrease power consumption according to a chip temperature. However, the increase in the power consumption due to the multiple refresh cannot be suppressed.

SUMMARY OF THE INVENTION

It is therefore an object of the present invention to provide a semiconductor memory device that can relieve refresh defective cells by multiple refresh and that can suppress power consumption during the refresh operation in response to an internal refresh command like in the self-refresh mode.

The above and other objects of the present invention can be accomplished by a semiconductor memory device comprising:

a plurality of memory cells requiring a refresh operation so as to hold stored information;

a refresh circuit having a first refresh mode for performing the refresh operation in response to an external refresh command supplied from the outside and a second refresh mode for performing the refresh operation in response to an internal refresh command automatically generated in an inside; and a first refresh cycle changing circuit that changes a refresh cycle of the first refresh mode independently from a refresh cycle of the second refresh mode.

In the present invention, the "refresh cycle" means the average time of execution the refresh operation in the same memory cell. In the present invention, the first refresh mode corresponds to the auto-refresh mode, for example, and the second refresh mode corresponds to the self-refresh mode, for example.

The first refresh cycle changing circuit can change the refresh cycle of the first refresh mode by changing the number of memory cells to be refreshed in response to the external refresh command.

It is preferable that the semiconductor memory device according to the present invention further includes a second refresh cycle changing circuit that changes the refresh cycle of the second refresh mode independently from the refresh cycle of the first refresh mode.

The second refresh cycle changing circuit can change the refresh cycle according to the second refresh mode, by changing the number of memory cells to be refreshed in response to the internal refresh command. In this case, the refresh cycle can be changed for only a specific address. Further, the refresh cycle according to the second refresh mode can be also changed by changing the generation frequency of the internal refresh command.

As explained above, according to the present invention, the refresh cycle according to the first refresh mode and the refresh cycle according to the second refresh mode can be independently controlled. Therefore, the refresh operation considering the characteristic in each mode can be executed. For example, when the first refresh mode is the auto-refresh mode and also when the second refresh mode is the self-refresh mode, power consumption during the self-refresh time can be decreased while effectively relieving the refresh defective cells, by narrowing the application range of the multiple refresh during the self-refresh time than the application range of the multiple refresh during the auto-refresh time.

BRIEF DESCRIPTION OF THE DRAWINGS

The above and other objects, features and advantages of this invention will become more apparent by reference to the following detailed description of the invention taken in conjunction with the accompanying drawings, wherein:

FIG. 8 is a table that summarizes the setting of the refresh cycle changing circuits, and characteristics obtained based on the setting;

DETAILED DESCRIPTION OF THE EMBODIMENTS

Preferred embodiments of the present invention will now be explained below with reference to the accompanying drawings.

Figure 1:
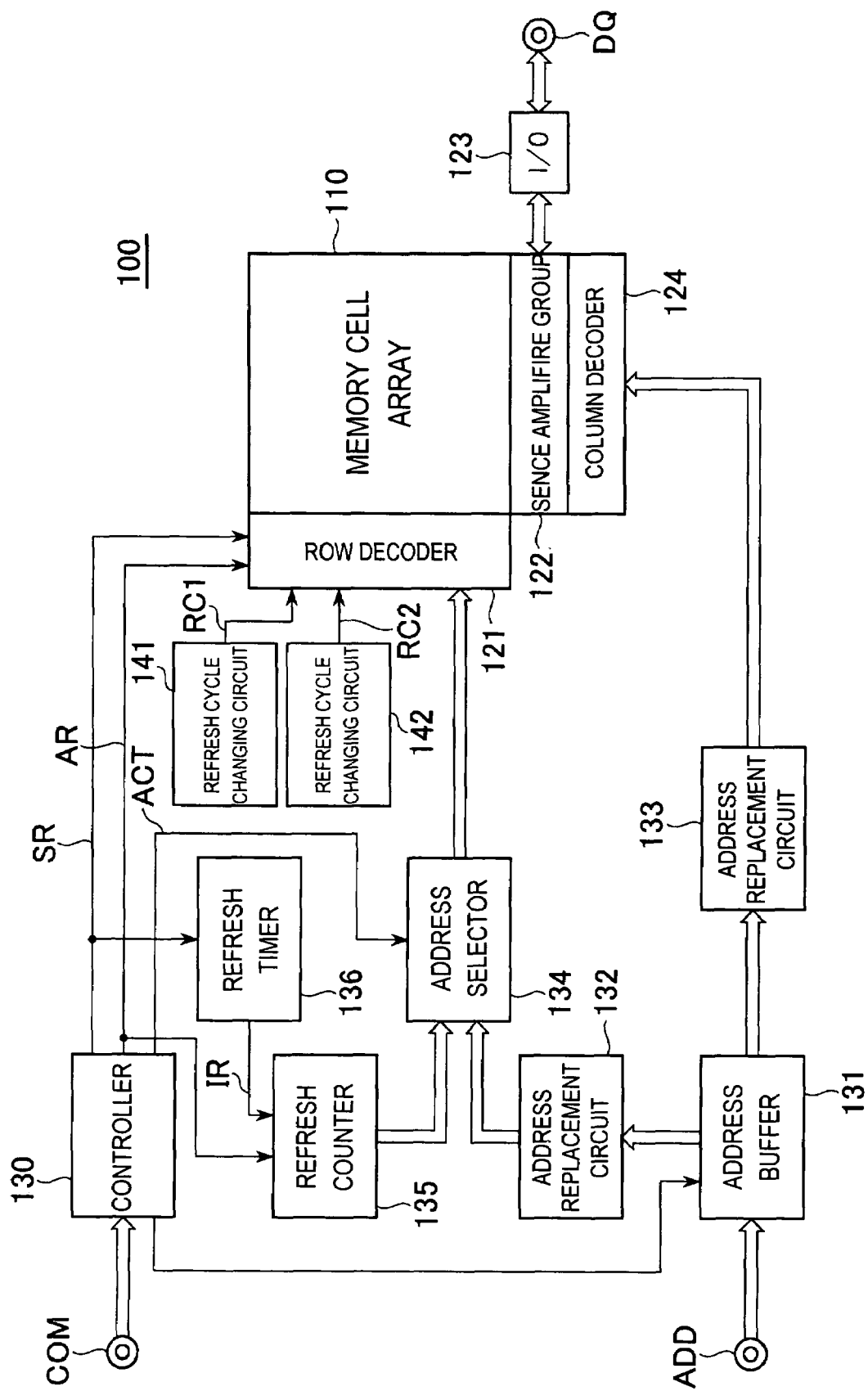
FIG. 1 is a block diagram showing a configuration of a semiconductor memory device according to a first preferred embodiment of the present invention.

FIG. 1 is a block diagram showing a configuration of a semiconductor memory device 100 according to a first preferred embodiment of the present invention.

As shown in FIG. 1, the semiconductor memory device 100 according to the first embodiment includes a memory cell array 110 having plural memory cells that need to hold information by the refresh operation. The semiconductor memory device 100 has a function (read function) of reading data stored in the address supplied via an address pin ADD, and outputting the read data via a data pin DQ, and a function (write function) of writing data supplied via the data pin DQ to the address supplied via the address pint ADD.

Figure 2:
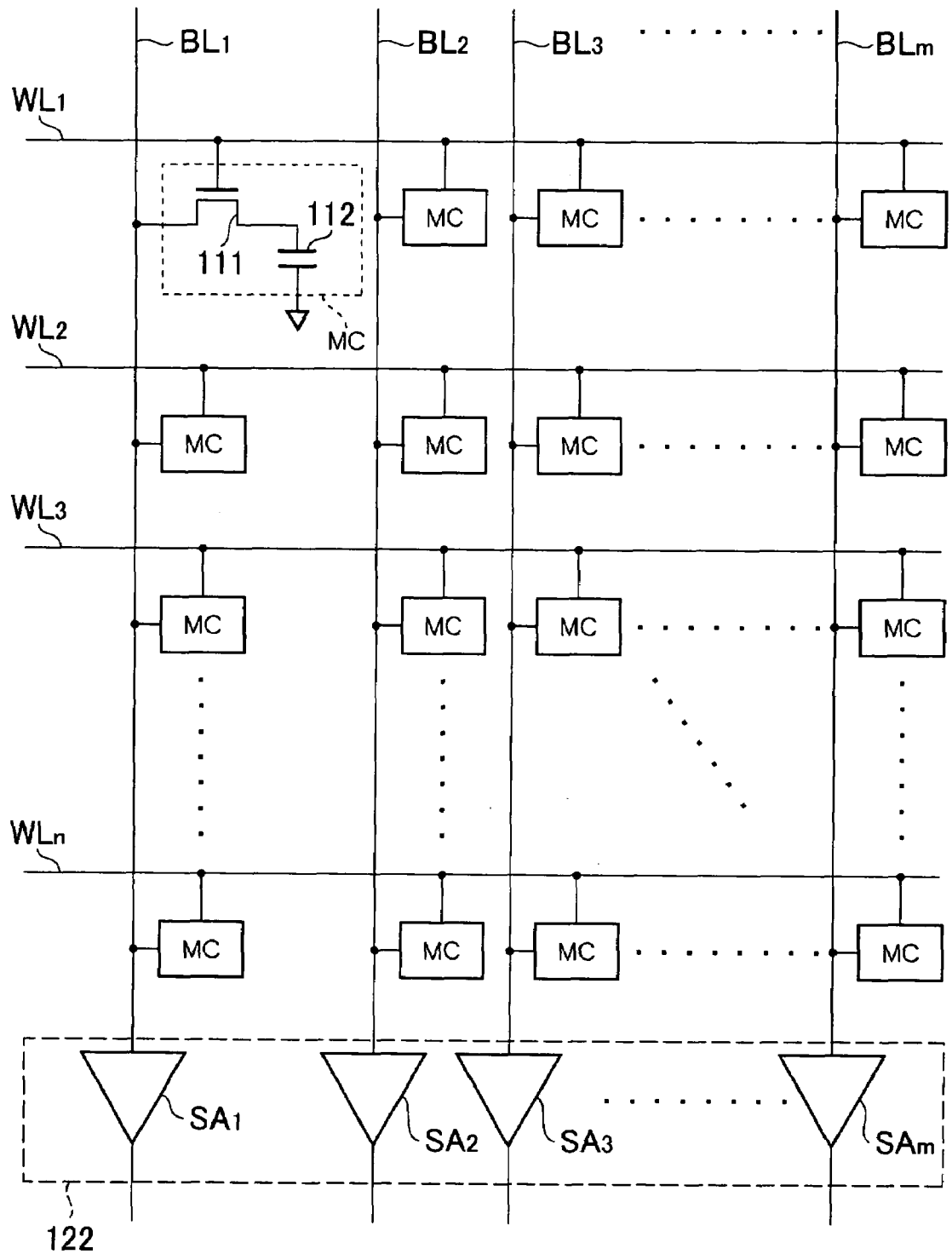
FIG. 2 is a circuit diagram schematically showing the configuration of the memory cell array shown in FIG. 1.

FIG. 2 is a circuit diagram schematically showing the configuration of the memory cell array 110.

As shown in FIG. 2, the memory cell array 110 has a matrix structure having plural word lines $WL_1$ to $WL_n$ crossed with plural bit lines $BL_1$ to $BL_m$, and has a memory cell MC located at each intersection. Each memory cell MC includes a series circuit of a MOS transistor 111 and a capacitor 112. A drain of the MOS transistor 111 is connected to the corresponding bit lines $BL_1$ to $BL_m$, and a gate of the MOS transistor 111 is connected to the corresponding word lines $WL_1$ to $WL_n$. With this arrangement, when a certain word line $WL_i$ changes to a high level, the capacitors 112 of all the memory cells MCs connected to the word line $WL_i$ are connected to the corresponding bit lines $BL_1$ to $BL_m$, respectively. A row decoder 121 shown in FIG. 1 controls the word lines $WL_1$ to $WL_n$.

On the other hand, the bit lines $BL_1$ to $BL_m$ are connected to a sense amplifier group 122 including corresponding sense amplifiers $SA_1$ to $SA_m$, respectively. With this arrangement, during a reading time, a signal read from the memory cell MC is amplified, and, during a writing time, a signal to be written to the memory cell MC is amplified. A column decoder 124 shown in FIG. 1 controls which sense amplifiers $SA_1$ to $SA_m$ should be connected to an I/O circuit 123. The column decoder 124 receives a column address supplied from an address replacement circuit 133, and connects one or two or more sense amplifiers $SA_1$ to $SA_m$ selected based on this to the I/O circuit 123, respectively.

An address buffer 131 is a circuit that temporarily holds an external address supplied via an address pin ADD. The held address is supplied to an address replacement circuit 132 or the address replacement circuit 133. Specifically, when the external address is a row address, this address is supplied to the address replacement circuit 132, and when the external address is a column address, this address is supplied to the address replacement circuit 133. A controller 130 executes this supply control, based on a "command" including a combination of external control signals RAS, CAS, CS, WE, etc, supplied via a control signal pin COM.

The address replacement circuits 132 and 133 are the circuits that replace a defective word line and a defective bit line with a redundant word line and a redundant bit line, respectively, by internally converting the defective row address and the defective column address, respectively. The defective word line and the defective bit line are a word line and a bit line, respectively, all the memory cells MCs connected to which cannot be used, due to a short-circuiting and the like. The memory cells MCs connected to the defective word line and the defective bit line cannot be relieved by the multiple refresh, unlike the refresh defective cells of which the information holding time is shorter than $T_{REF}$. Therefore, the addresses need to be relieved by replacing the addresses for each word line and for each bit line. The address replacement circuits 132 and 133 are the circuits that execute these address replacement.

The address replacement circuits 132 and 133 include fuse element groups that store defective addresses, and a comparator circuit that detects access to the defective addresses. Because details of the address replacement circuits 132 and 133 are not directly relevant to the scope of the present invention, explanations thereof will be omitted.

The row address replaced by the address replacement circuit 132 is supplied to an address selector 134. A column address replaced by the address replacement circuit 133 is supplied to the column decoder 124 as described above.

The address selector 134 selects any one of the row address supplied by the address replacement circuit 132 and the row address supplied by a refresh counter 135, and supplies the selected address to the row decoder 121. The controller 130 executes this control, based on a command supplied via a control signal pin COM. Specifically, when the command supplied via the control signal pin COM indicates the read operation or the write operation, an activation signal ACT signal supplied from the controller 130 is activated, and the address selector 134 selects a row address from the address replacement circuit 132. On the other hand, when the command supplied via the control signal pin COM indicates a refresh operation, the activation signal ACT signal becomes inactive. Based on this, the address selector 134 selects the row address from the refresh counter 135.

An auto-refresh command and a self-refresh command are present as refresh commands supplied from the control signal pin COM. When the auto-refresh command is issued, the controller 130 activates an auto-refresh signal AR. The auto-refresh signal AR is supplied to the refresh counter 135, and the refresh counter 135 increments (or decrements) the count value in response to this. The count value of the refresh counter indicates a row address to be refreshed (a refresh address). Therefore, when the auto-refresh command is issued from the outside, a refresh operation is executed to the refresh address indicated by the refresh counter 135.

On the other hand, when the self-refresh command is issued, the controller 130 activates a self-refresh signal SR. The self-refresh signal SR is supplied to a refresh timer 136. The refresh timer 136 periodically automatically generates an internal refresh command IR in response to this. When the internal refresh command IR is activated, the count value of the refresh counter 135 is incremented (or decremented). Therefore, when the self-refresh command is issued from the outside, the refresh operation is sequentially executed in response to the internal refresh command IR automatically generated in the inside.

Thus, the controller 130, the refresh counter 135, and the refresh timer 136 constitute a refresh circuit having a auto-refresh mode (first refresh mode) for performing the refresh operation in response to the external refresh command supplied from the outside and a self-refresh mode (second refresh mode) for performing the refresh operation in response to an internal refresh command IR automatically generated in an inside.

The auto-refresh command is a command issued in between the read commands or the write commands, and is issued when necessary under the control of the memory controller so that all memory cells are refreshed within the period of $t_{REF}$. Therefore, the auto-refresh command is often issued continuously in a short cycle (at the interval of 100 ns, for example), and has a characteristic that the power source voltage changes easily. Because a chip temperature rises due to the execution of the read operation or the write operation, the information holding characteristic of the memory cell decreases easily. Therefore, when a decision is made based on the condition of the auto-refresh time, there is a tendency that there are many refresh defective cells.

On the other hand, the self-refresh command is issued only once during a standby period when the read operation or the write operation is not executed, that is, at the entry time in the power down state. When the self-refresh command is issued, the internal refresh command IR is periodically automatically generated as described above so that all the memory cells are refreshed within the $t_{REF}$ period. The generation cycle of the internal refresh command IR is set to a largest length (8 μs, for example) in the limit in which all the memory cells are refreshed within the period of $t_{REF}$. Further, because the read operation or the write operation is not executed during this period, a variation of a power source voltage does not occur easily. Because the chip temperature is held at a low level, the information holding characteristic of the memory cells is kept in the high state. Therefore, when a decision is made based on the condition of the self-refresh time, there is a tendency that there are few refresh defective cells.

As shown in FIG. 1, the auto-refresh signal AR and the self-refresh signal SR are also supplied to the row decoder 121. Accordingly, the row decoder 121 can discriminate whether the current access is made based on the read operation or the write operation, or based on the refresh operation.

Further, the semiconductor memory device 100 includes refresh cycle changing circuits 141 and 142, as shown in FIG. 1. The refresh cycle changing circuit 141 decides a refresh cycle in the auto-refresh time, and the refresh cycle changing circuit 142 decides a refresh cycle in the self-refresh time.

Figure 3:
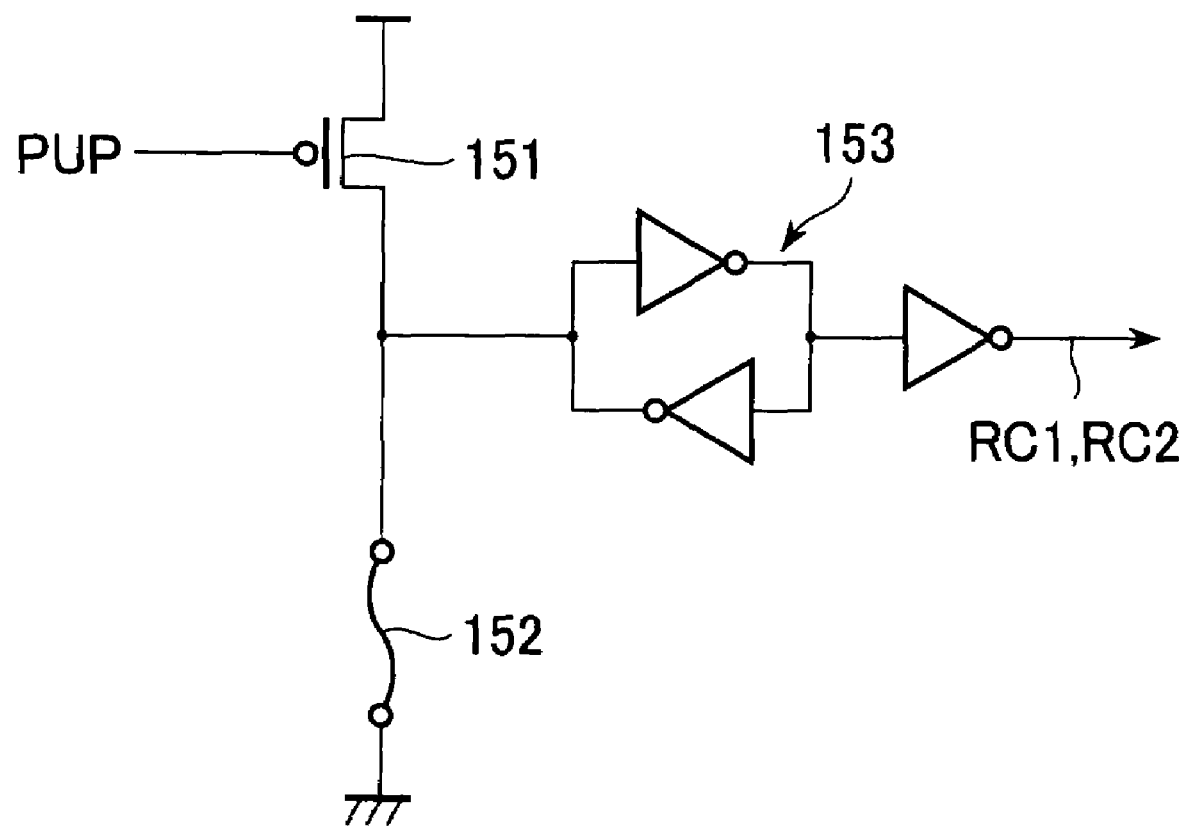
FIG. 3 is a circuit diagram of the refresh cycle changing circuits shown in FIG. 1.

FIG. 3 is a circuit diagram of the refresh cycle changing circuits 141 and 142.

As shown in FIG. 3, in the first embodiment, each of the refresh cycle changing circuits 141 and 142 includes a series circuit of a transistor 151 and a fuse element 152, and a latch circuit 153 that holds a logic level of these connection points. A power-up signal PUP activated at the reset time is supplied to the gate of the transistor 151. Therefore, when the semiconductor memory device 100 is reset, the logic level of refresh cycle set signals RC1 and RC2 becomes a low level when the fuse element 152 is not disconnected. When the fuse element 152 is disconnected, the logic level of the refresh cycle set signals RC1 and RC2 becomes a high level. The latch circuit 153 holds the logic level of the refresh cycle set signals RC1 and RC2.

Disconnection of the fuse element 152 is carried out at the manufacturing time. When the refresh cycle is set to the standard value ($=t_{REF}$), the fuse element 152 is not disconnected, and when the refresh cycle is set to a half ($=t_{REF}/2$), the fuse element 152 is disconnected. Therefore, when the fuse element 152 included in the refresh cycle changing circuit 141 is disconnected, the refresh cycle during the auto-refresh time is decreased to a half. When the fuse element 152 included in the refresh cycle changing circuit 142 is disconnected, the refresh cycle during the self-refresh time is decreased to a half. As explained above, the "refresh cycle" means the average time of executing the refresh operation to the same memory cell.

The element for changing over the logic level of the refresh cycle set signals RC1 and RC2 is not limited to the fuse element, and other nonvolatile memory circuit can be also used.

The refresh cycle set signals RC1 and RC2 generated in this way are supplied to the row decoder 121 as shown in FIG. 1. When the auto-refresh signal AR is activated, the row decoder 121 selects the number of word lines to be activated by referencing the refresh cycle set signal RC1. Similarly, when the self-refresh signal SR is activated, the row decoder 121 selects the number of word lines to be activated by referencing the refresh cycle set signal RC2.

The operation of the semiconductor memory device 100 at the refresh time is explained next.

Figure 4:
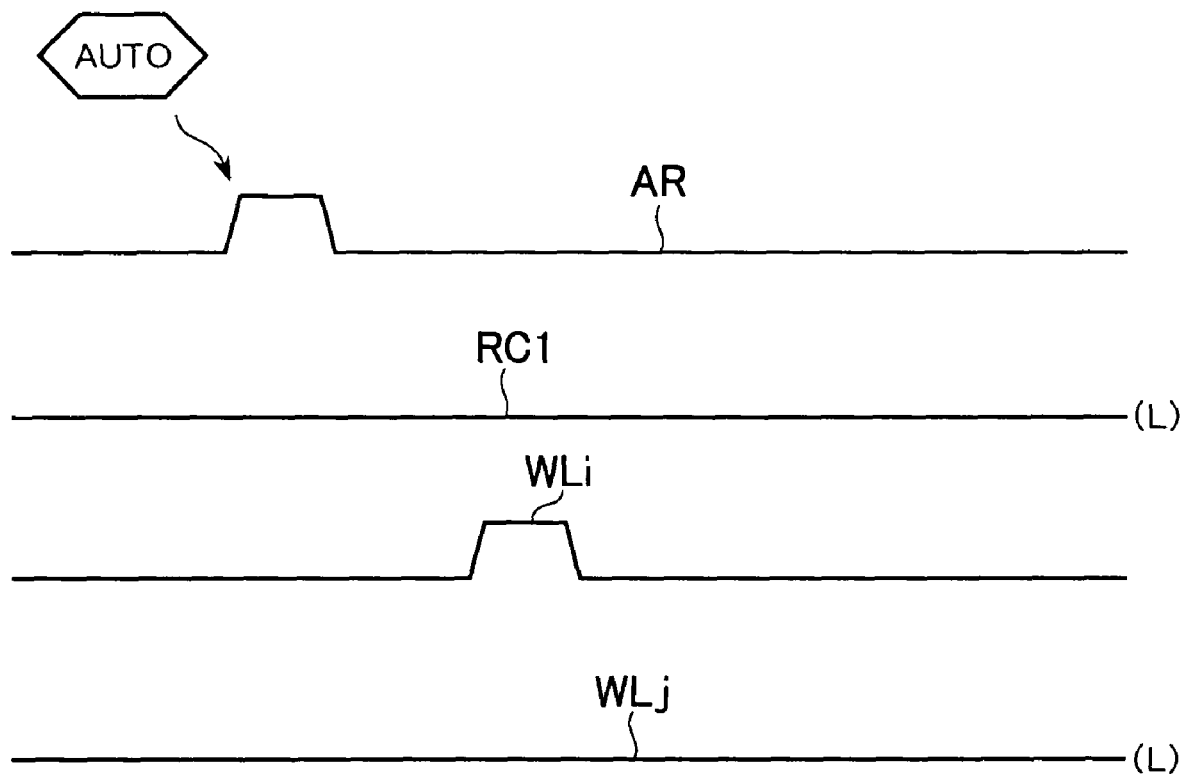
FIG. 4 is a timing diagram for explaining the operation at the auto-refresh time when the first refresh cycle set signal is at the low level.
Figure 5:
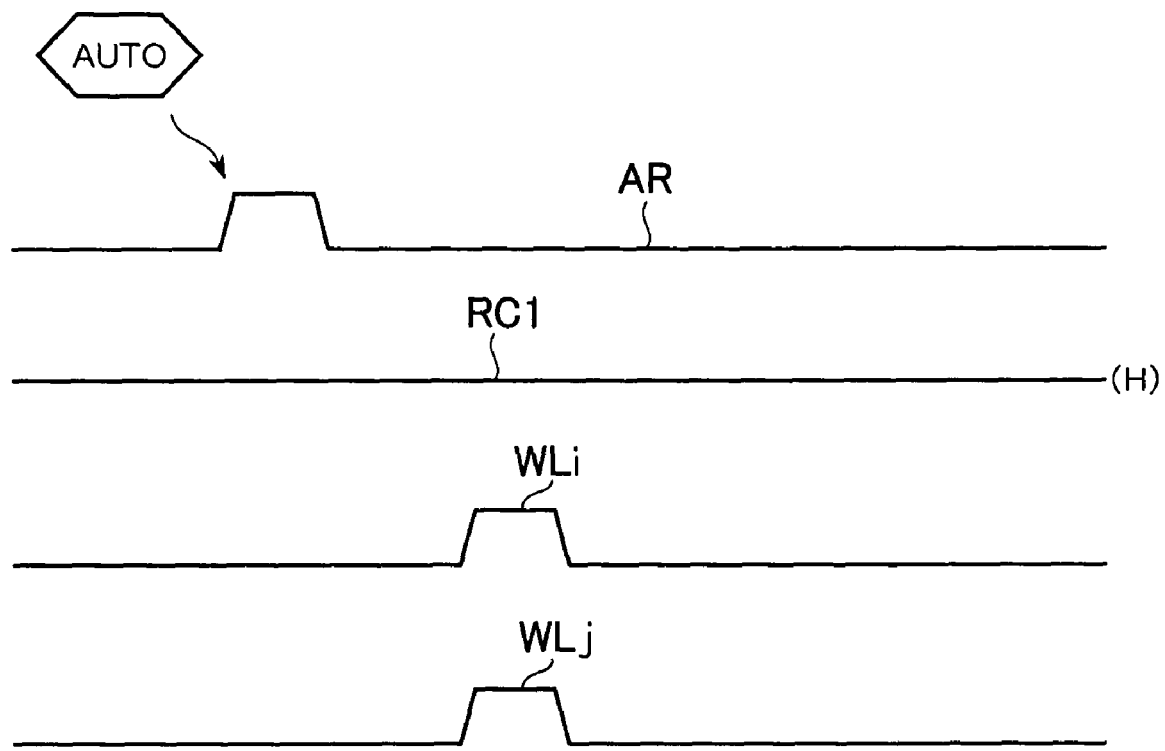
FIG. 5 is a timing diagram for explaining the operation at the auto-refresh time when the first refresh cycle set signal is at the high level.

FIG. 4 and FIG. 5 are timing diagrams for explaining the operation at the auto-refresh time. FIG. 4 depicts the operation when the refresh cycle set signal RC1 is at the low level, and FIG. 5 shows the operation when the refresh cycle set signal RC1 is at the high level.

As shown in FIG. 4 and FIG. 5, when the auto-refresh command is issued from the outside, a count value of the refresh counter 135 is supplied to the row decoder 121 via the address selector 134. In this case, when the refresh cycle set signal RC1 is at the low level, the word line $WL_i$ assigned by the count value of the refresh counter 135 is activated, and all memory cells connected to this word line are refreshed as shown in FIG. 4. The auto-refresh command is supplied from the outside so that all the word lines are activated within the normal refresh cycle ($=t_{REF}$). Therefore, the refresh cycle is the normal cycle ($=t_{REF}$).

On the other hand, when the refresh cycle set signal RC1 is at the high level, not only the above word line $WL_i$ but also the other word line $WL_j$ is activated at the same time, and all the memory cells connected to these word lines are refreshed. In other words, by executing the multiple refresh, memory cells that are double of the normal memory cells are refreshed.

The word line $WL_j$ that is activated at the same time as the word line $WL_i$ includes a word line of which only the higher one bit of the row address is different from that of the word line $WL_i$, for example. In this case, when the count value of the refresh counter 135 indicates the word line $WL_i$, and also when the count value of the refresh counter 135 indicates the word line $WL_j$, both the word lines $WL_i$ and $WL_j$ are activated. Because, the same word line is activated twice within the normal refresh cycle ($=t_{REF}$), the refresh cycle becomes one half of the normal refresh cycle ($=t_{REF}/2$).

As explained above, the refresh cycle in the auto-refresh time can be changed by the refresh cycle set signal RC1. Even when the refresh cycle in the auto-refresh time is changed, this does not affect the refresh cycle in the self-refresh time. Therefore, the refresh cycle can be assigned by considering the condition of the auto-refresh, that is, by considering the variation of the power source voltage or the rise of the chip temperature.

Figure 6:
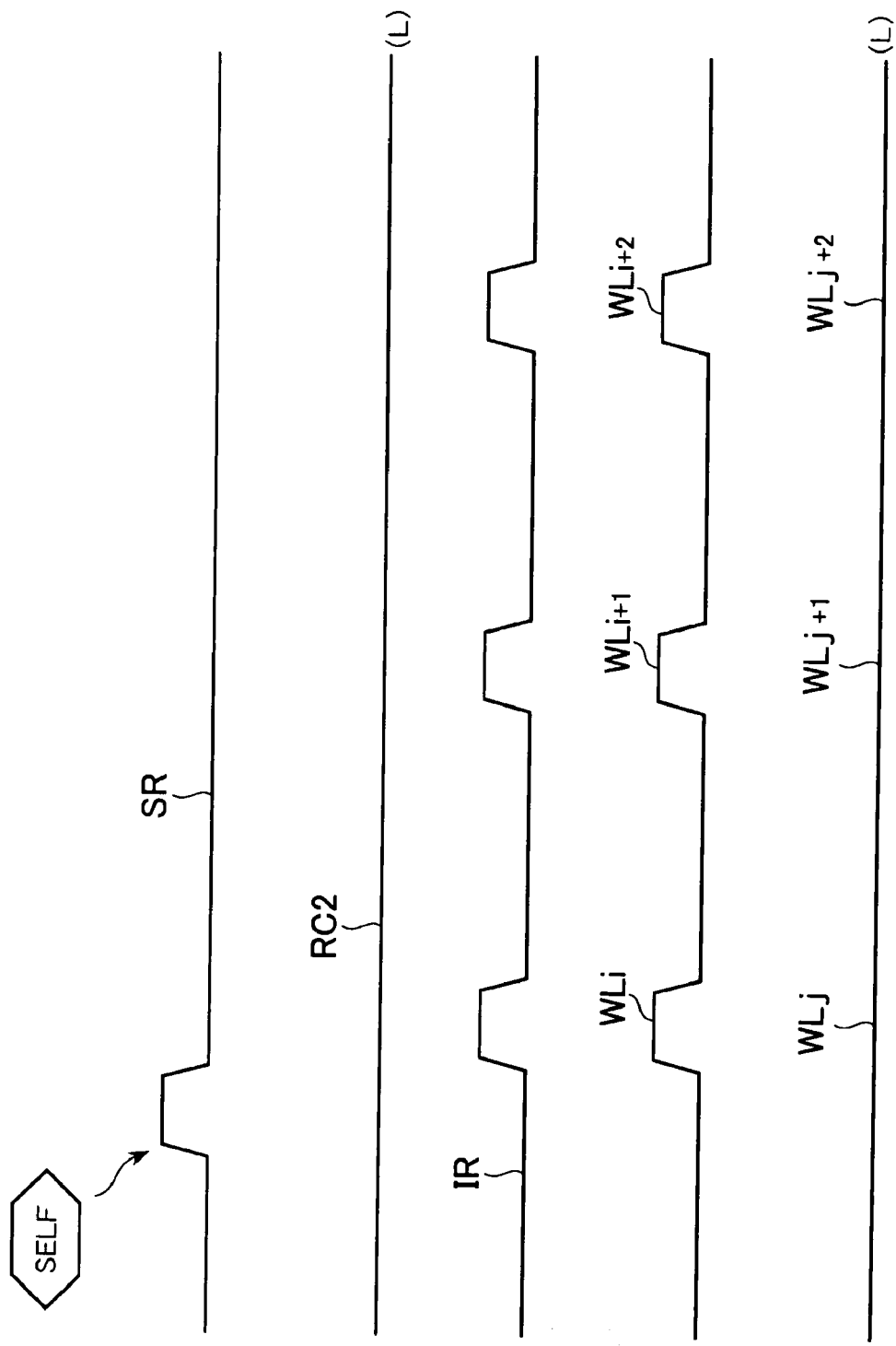
FIG. 6 is a timing diagram for explaining the operation in the self-refresh time when the second refresh cycle set signal is at the low level.
Figure 7:
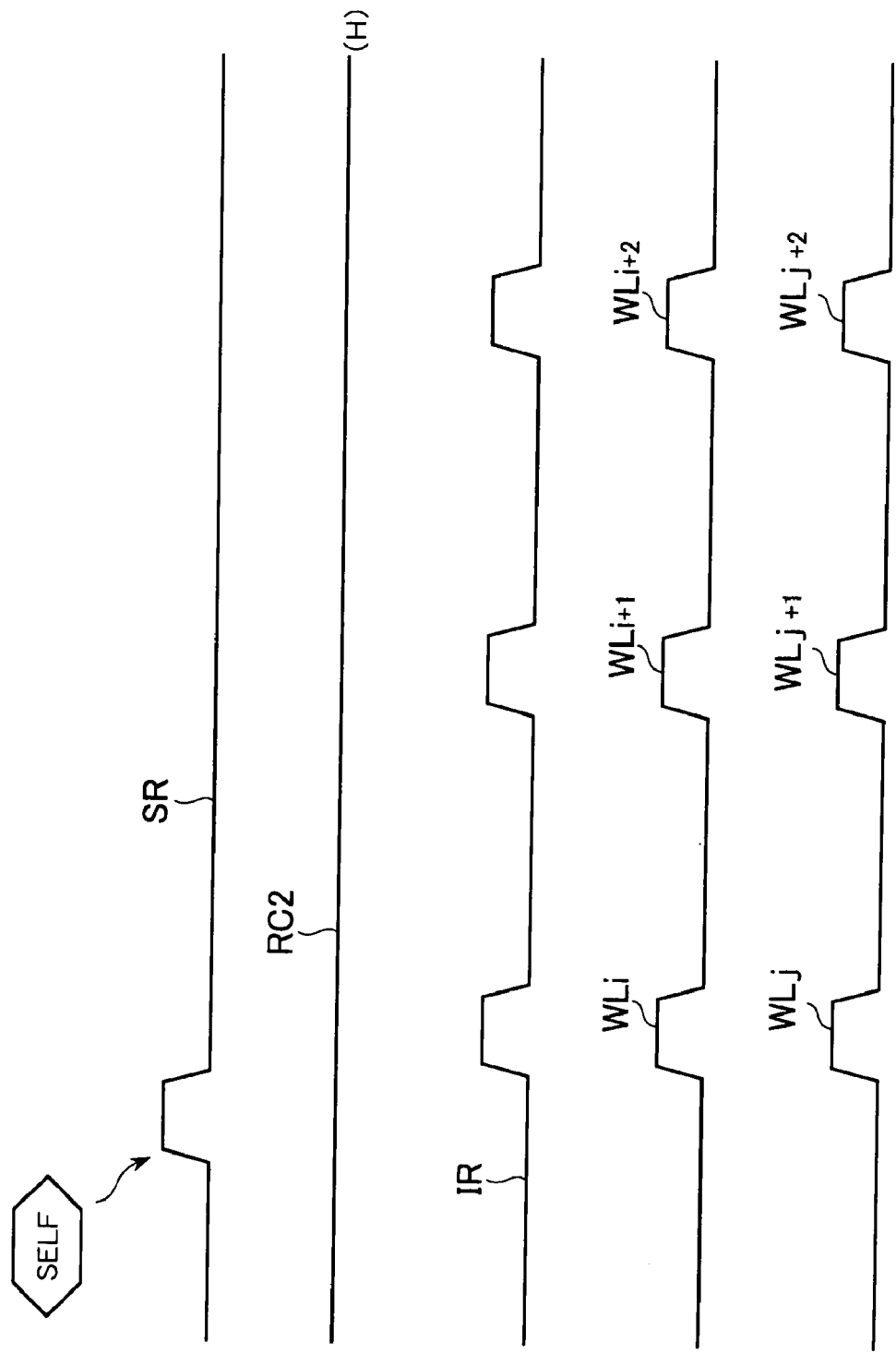
FIG. 7 is a timing diagram for explaining the operation in the self-refresh time when the second refresh cycle set signal is at the high level.

FIG. 6 and FIG. 7 are timing diagrams for explaining the operation in the self-refresh time. FIG. 6 depicts the operation when the refresh cycle set signal RC2 is at the low level. FIG. 7 depicts the operation when the refresh cycle set signal RC2 is at the high level.

As shown in FIG. 6 and FIG. 7, when the self-refresh command is issued from the outside, the internal refresh command IR is periodically generated from the refresh timer 136. In response to this, the refresh counter 135 is periodically incremented (or decremented), and this value is supplied to the row decoder 121 via the address selector 134. In this case, when the refresh cycle set signal RC2 is at the low level, the word lines $WL_i$, $WL_{i+1}$, $WL_{i+2}$, $WL_{i+3}$, . . . that are sequentially assigned by the count value of the refresh counter 135 are sequentially activated, and all memory cells connected to these word lines are refreshed as shown in FIG. 6. The refresh counter 135 periodically generates the internal refresh command IR so that all the word lines are activated within the normal refresh cycle ($=t_{REF}$). Therefore, the refresh cycle is the normal cycle ($=t_{REF}$).

On the other hand, when the refresh cycle set signal RC2 is at the high level, not only the above word lines $WL_i$, $WL_{i+1}$, $WL_{i+2}$, $WL_{i+3}$, . . . but also the other word lines $WL_j$, $WL_{j+1}$, $WL_{j+2}$, $WL_{j+3}$, . . . are activated sequentially at the same time, and all the memory cells connected to these word lines are refreshed. In other words, by executing the multiple refresh, memory cells that are double of the normal memory cells are refreshed. Because, the same word line is activated twice within the normal refresh cycle ($=t_{REF}$), the refresh cycle becomes one half of the normal refresh cycle ($=t_{REF}/2$).

As explained above, the refresh cycle in the self-refresh time can be changed by the refresh cycle set signal RC2. Even when the refresh cycle in the self-refresh time is changed, this does not affect the refresh cycle in the auto-refresh time. Therefore, the refresh cycle can be assigned by considering the power consumption permissible in the power down state.

As explained above, the semiconductor memory device 100 according to the first embodiment can independently change the refresh cycle in the auto-refresh time and the refresh cycle in the self-refresh time. Therefore, power consumption permissible in the power down state can be satisfied while decreasing the refresh cycle considering the condition of the auto-refresh.

FIG. 8 is a table that summarizes the setting of the refresh cycle changing circuits 141 and 142, and characteristics obtained based on the setting.

As shown in FIG. 8, in the semiconductor memory device 100 according to the first embodiment, three kinds of setting methods of the refresh cycle changing circuits 141 and 142 are assumed. A first setting method is a method of setting the refresh cycle to the normal refresh cycle ($=t_{REF}$) for both in the auto-refresh time and the self-refresh time. This method is selected when the information holding characteristic of the total memory cells is high and also when the number of memory cells requiring refresh-relief is small. To select this setting, the fuse elements 152 included in the refresh cycle changing circuits 141 and 142 are kept connected. When this setting is selected, power consumption becomes the smallest.

A second setting method is the setting of the refresh cycle to a half of the normal cycle ($=t_{REF}/2$) in the auto-refresh time only. This method is selected when the number of memory cells requiring refresh-relief in the condition of the self-refresh time is small while the number of memory cells requiring refresh-relief in the condition of the auto-refresh time is large. To select this setting, the fuse element 152 included in the refresh cycle changing circuit 141 is disconnected. When this setting is selected, refresh relief of memory cells having a low information-holding characteristic can be performed in the auto-refresh time, without increasing the power consumption in the self-refresh time.

A third setting method is a method of setting the refresh cycle to a half of the normal refresh cycle ($=t_{REF}/2$) for both in the auto-refresh time and the self-refresh time. This method is selected when the information holding characteristic of the total memory cells is low and also when the number of memory cells requiring refresh-relief is large. To select this setting, the fuse elements 152 included in the refresh cycle changing circuits 141 and 142 are disconnected. When this setting is selected, power consumption becomes the largest. However, the memory cells can be relieved without disposing of a semiconductor memory device having a low information-holding characteristic in total.

As other setting method (a fourth setting method), only the refresh cycle in the self-refresh time is set to a half of the normal refresh cycle ($=t_{REF}/2$). However, this setting method has low practicability.

A second preferred embodiment of the present invention is explained next.

Figure 9:
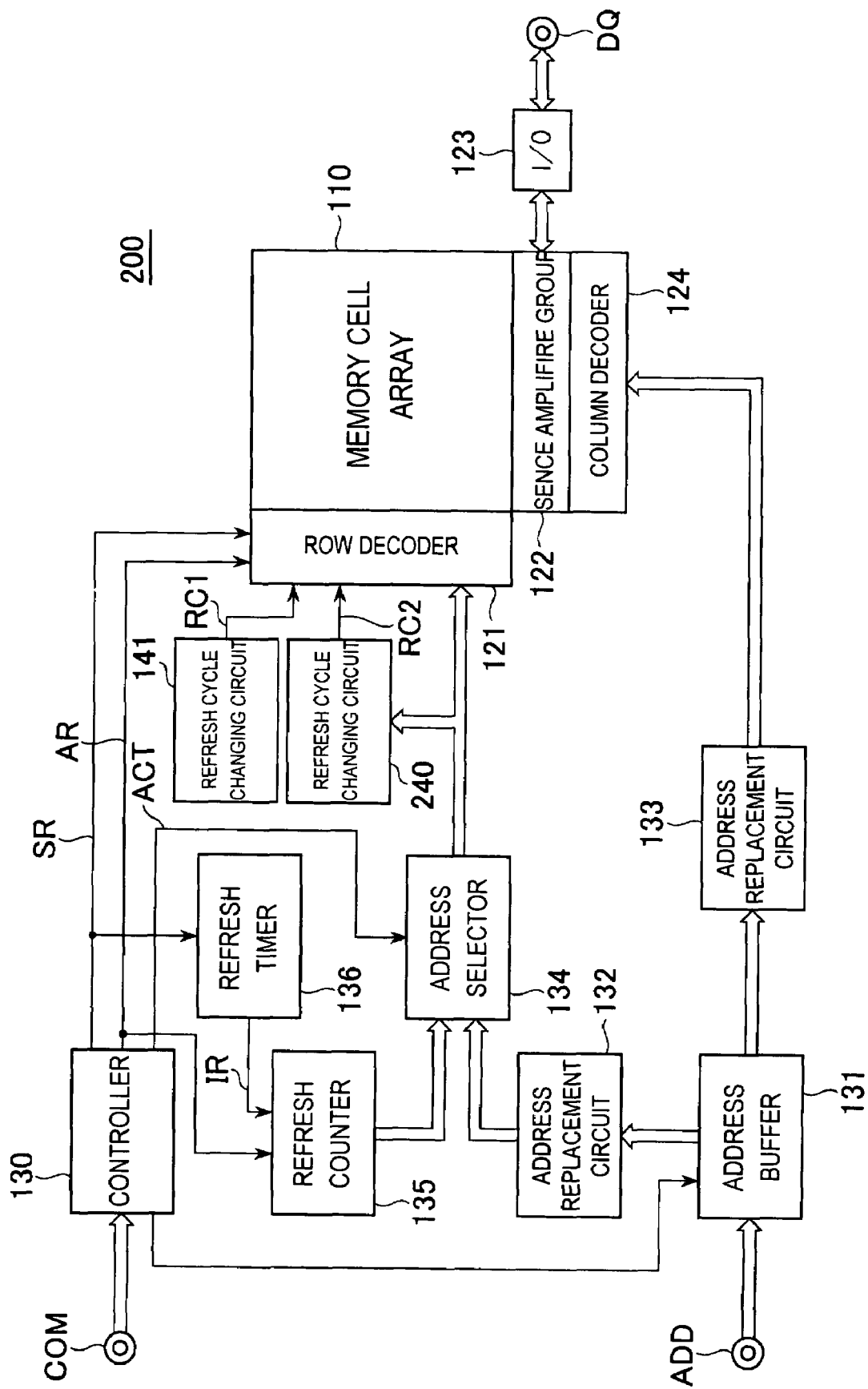
FIG. 9 is a block diagram showing a configuration of a semiconductor memory device according to the second embodiment of the present invention.

FIG. 9 is a block diagram showing a configuration of a semiconductor memory device 200 according to the second embodiment.

The semiconductor memory device 200 according to the second embodiment is different from the semiconductor memory device 100 according to the first embodiment in that the refresh cycle changing circuit 142 is replaced by a refresh cycle changing circuit 240. In other points, the semiconductor memory device 200 according to the second embodiment is the same as the semiconductor memory device 100 according to the first embodiment. Therefore, constituent elements that are the same as those in the first embodiment are denoted by like reference letters and numerals, and redundant explanations thereof will be omitted.

Figure 10:
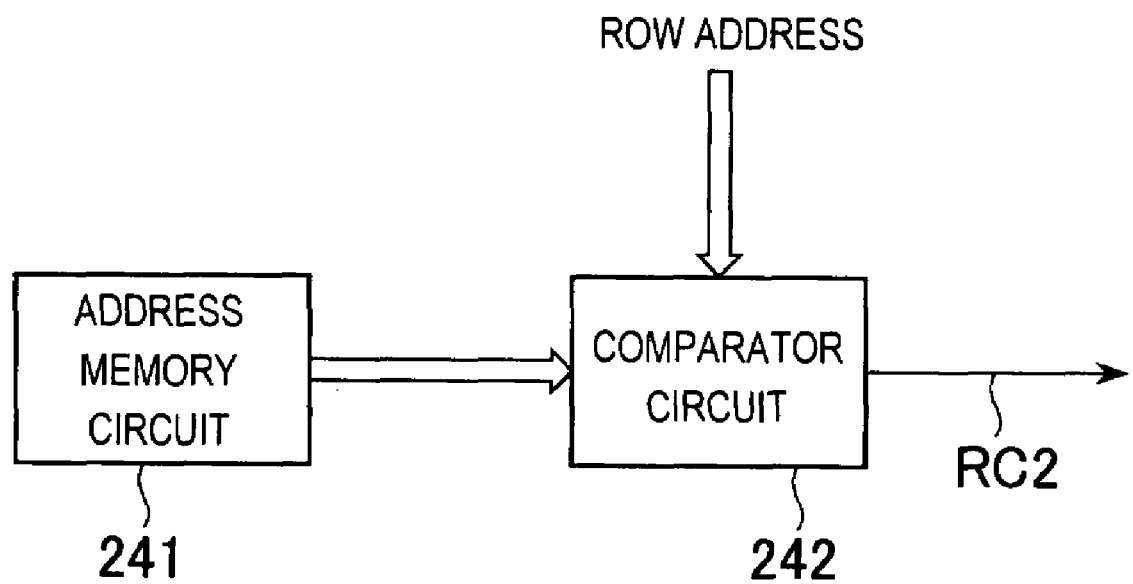
FIG. 10 is a block diagram showing a configuration of the refresh cycle changing circuit shown in FIG. 9.

FIG. 10 is a block diagram showing a configuration of the refresh cycle changing circuit 240.

As shown in FIG. 10, the refresh cycle changing circuit 240 includes an address memory circuit 241 and a comparator circuit 242. The address memory circuit 241 stores a "relevant address" relevant to the address of the memory cell requiring a refresh-relief. A "relevant address" relevant to one or two or more addresses of a memory cell having a low information-holding characteristic detected at the manufacturing state is written into the address memory circuit 241. The "relevant address" is not the address of a memory cell requiring a refresh-relief, but is the address of the memory cell of which only a part of bits is different from that of the address of the memory cell requiring the refresh-relief. For example, the "relevant address" is the address of which only the higher one bit is different from that of the address requiring the refresh-relief.

The comparator circuit 242 compares the row address supplied from the address selector 134 with the address stored in the address memory circuit 241. When both addresses coincide with each other, the comparator circuit 242 activates the refresh cycle set signal RC2 to a high level. As explained above, the refresh cycle changing circuit 240 has the circuit configuration similar to those of the address replacement circuits 132 and 133.

Figure 11:
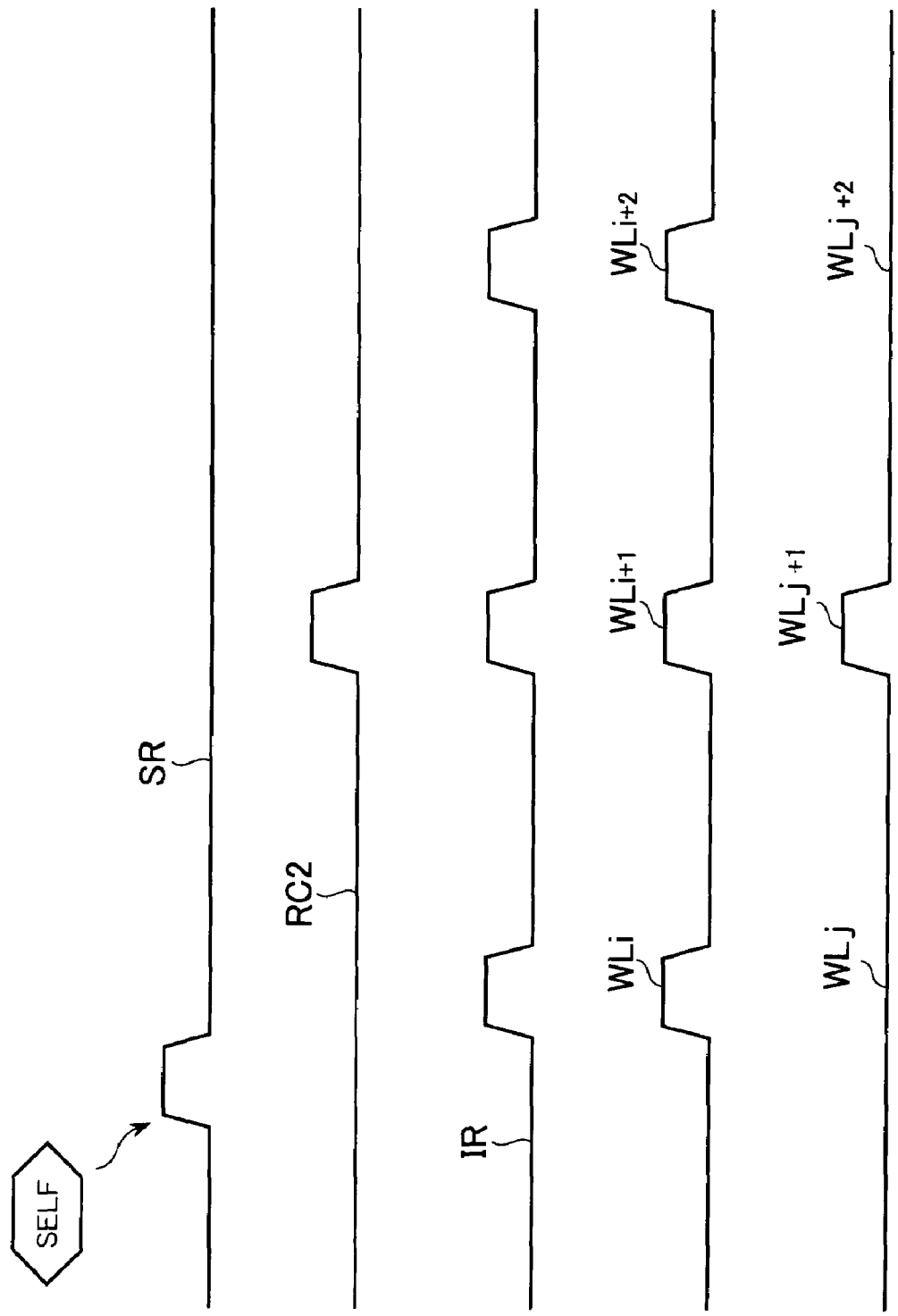
FIG. 11 is a timing diagram for explaining the operation in the self-refresh time according to the second embodiment of the present invention.

FIG. 11 is a timing diagram for explaining the operation in the self-refresh time.

As shown in FIG. 11, when a self-refresh command is issued from the outside, the refresh timer 136 periodically generates the internal refresh command IR. In response to this, the refresh counter 135 is periodically incremented (or decremented). When the value does not coincide with the address stored in the address memory circuit 241, the refresh cycle set signal RC2 becomes a low level. Therefore, only the word lines $WL_i$, $WL_{i+1}$, $WL_{i+2}$, $WL_{i+3}$, . . . assigned by the count value of the refresh counter 135 are sequentially activated.

On the contrary, when the count value of the refresh counter 135 coincides with the address stored in the address memory circuit 241, the refresh cycle set signal RC2 becomes a high level. As a result, not only the word lines $WL_i$, $WL_{i+1}$, $WL_{i+2}$, $WL_{i+3}$, . . . that are assigned by the count value of the refresh counter 135, but also the other word line $W_{Lji+1}$ connected to the memory cell requiring the refresh-relief is also activated at the same time. Consequently, only the word line connected to the memory cell requiring the refresh-relief is activated twice within the normal refresh cycle ($=t_{REF}$). Therefore, the refresh cycle of other word lines is the normal cycle ($=t_{REF}$).

As explained above, the semiconductor memory device 200 according to the second embodiment can select a memory cell requiring a refresh-relief in the self-refresh time. Therefore, there is a possibility of decreasing the power consumption in the power down state while relieving the memory cell having a low information-holding characteristic by the multiple refresh.

In the second embodiment, a specific memory is refresh-relieved in only the self-refresh time. By replacing the refresh cycle changing circuit 141 with a circuit similar to the refresh cycle changing circuit 240, only a specific memory cell can be refresh-relieved in the auto-refresh time as well. However, the power consumption during the auto-refresh is not a significant problem, unlike the power consumption during the self-refresh. Therefore, considering the area occupied by the address memory circuit 241, the configuration for refresh-relieving a specific memory cell in the self-refresh time only is preferable.

A third preferred embodiment of the present invention is explained next.

Figure 12:
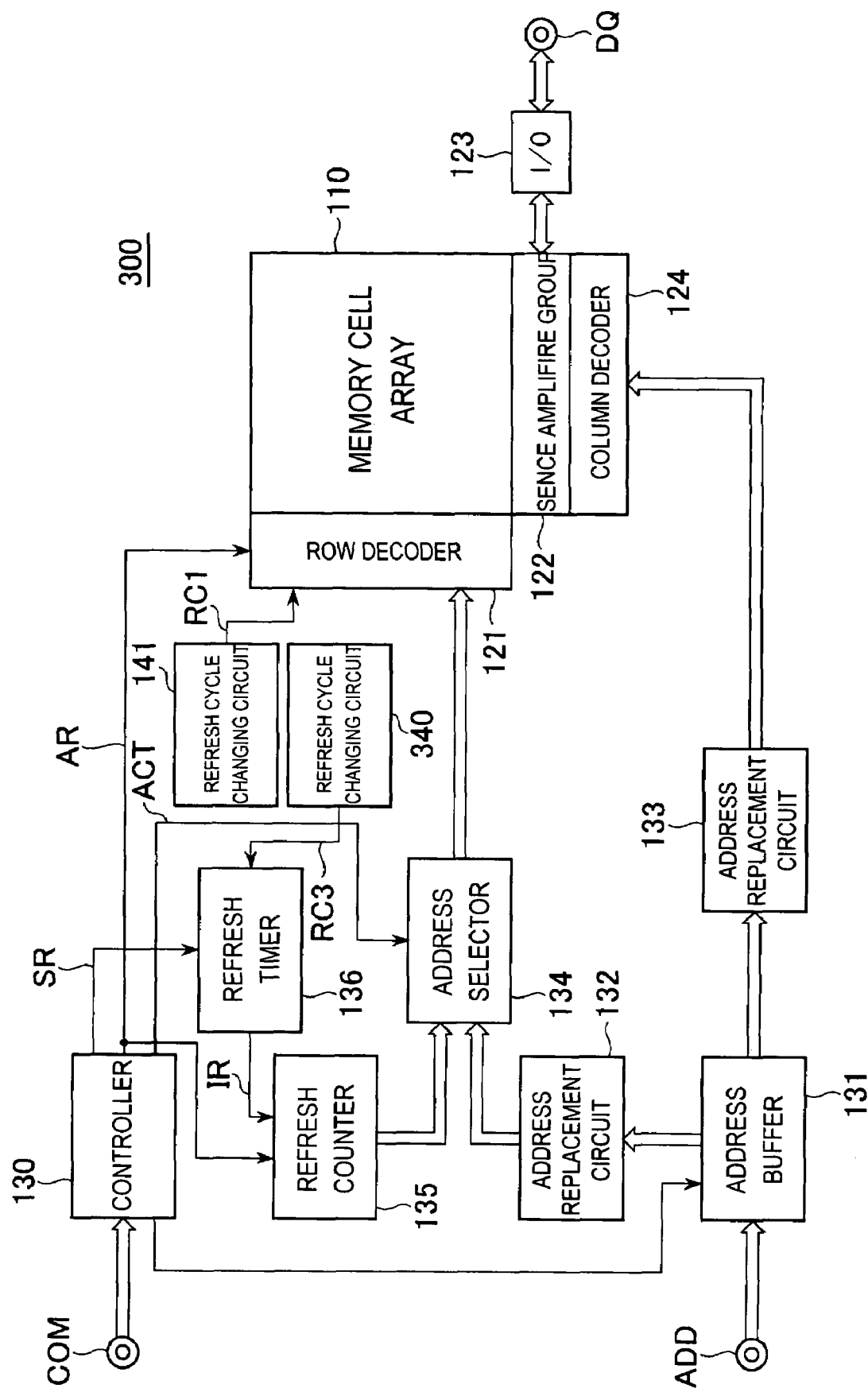
FIG. 12 is a block diagram showing a configuration of a semiconductor memory device according to the third embodiment of the present invention.

FIG. 12 is a block diagram showing a configuration of a semiconductor memory device 300 according to the third embodiment of the present invention.

The semiconductor memory device 300 according to the third embodiment is different from the semiconductor memory device 100 according to the first embodiment in that the refresh cycle changing circuit 142 is replaced by a refresh cycle changing circuit 340. In other points, the semiconductor memory device 300 according to the third embodiment is the same as the semiconductor memory device 100 according to the first embodiment. Therefore, constituent elements that are the same as those in the first embodiment are denoted by like reference letters or numerals, and redundant explanations thereof will be omitted.

The refresh cycle changing circuit 340 generates a refresh cycle set signal RC3 including a digital value or an analog value of plural bits. While a detailed circuit configuration is not shown, a circuit including fuse elements corresponding to the number of bits of the refresh cycle set signal RC3 can be used, for example.

As shown in FIG. 12, the refresh cycle set signal RC3 is supplied to the refresh timer 136, and the timer cycle of the refresh timer 136 is assigned accordingly. With this arrangement, the generation frequency of the internal refresh command IR can be changed. Therefore, the refresh cycle in the self-refresh time can be adjusted corresponding to the total information holding characteristic.

As explained above, because the semiconductor memory device 300 according to the third embodiment can adjust the refresh cycle in the self-refresh time, power consumption in the power down state can be optimized by considering the total information holding characteristic. In other words, when the total information holding characteristic is high, power consumption in the power down state can be decreased by setting the timer cycle longer than the normal cycle. When the total information holding characteristic is low, the timer cycle is set shorter than the normal cycle. With this arrangement, refresh-relief can be carried out while suppressing the increase of power consumption in the power down state to the minimum.

While a preferred embodiment of the present invention has been described hereinbefore, the present invention is not limited to the aforementioned embodiment and various modifications can be made without departing from the spirit of the present invention. It goes without saying that such modifications are included in the scope of the present invention.

In each of the above embodiments, while multiple refresh is executed by simultaneously activating two word lines, for example, the number of word lines that are simultaneously activated is not limited to two and can be three or more.

In each of the above embodiments, while multiple refresh is executed by simultaneously activating two word lines, for example, the word lines to be multiple refreshed do not need to be activated simultaneously, and can be activated by slightly delaying the timing.

What is claimed is:

1. A semiconductor memory device, comprising:
a plurality of memory cells requiring a refresh operation so as to hold stored information; and
a refresh circuit performing the refresh operation to memory cells connected to a predetermined number of word lines in a first refresh mode and performing the refresh operation to memory cells connected to less than the predetermined number of word lines in a second fresh mode,
wherein the refresh operation in the first refresh mode is performed in response to an external refresh command supplied from outside the semiconductor memory device and the refresh operation in the second refresh mode is performed in response to an internal refresh command generated automatically in the semiconductor memory device,
wherein the refresh circuit includes a first refresh cycle changing circuit and a second refresh cycle changing circuit,
wherein the first refresh cycle changing circuit performs the refresh operation to the memory cells connected to the predetermined number of word lines in the first refresh mode, and
wherein the second refresh cycle changing circuit performs the refresh operation to the memory cells connected to less than the predetermined number of word lines in the second refresh mode.

2. The semiconductor memory device as claimed in claim 1, wherein the first refresh cycle changing circuit and the second refresh cycle changing circuit include a first nonvolatile memory element and a second nonvolatile memory element, respectively,
wherein the memory cells connected to the predetermined number of word lines are refreshed when the first nonvolatile memory element is in a first state, and
wherein the memory cells connected to less than the predetermined number of word lines are refreshed when the second nonvolatile memory element is in a second state.

3. A semiconductor memory device, comprising:
a plurality of word lines;
a plurality of bit lines;
a plurality of memory cells each disposed at an associated intersection of the word lines and the bit lines;
a refresh circuit performing a refresh operation to refresh memory cells selected from said plurality of memory cells when a refresh request signal is activated;
a program circuit controlling the refresh circuit so as to perform the refresh operation to selected memory cells connected to a first number of word lines in a first mode every time the refresh request signal is activated and controlling the refresh circuit so as to perform the refresh operation to selected memory cells connected to a second number different from the first number of word lines in a second mode when the refresh request signal is activated;
a refresh request signal generator generating a second refresh request signal; and
a second program circuit controlling the refresh circuit so as to perform the refresh operation to selected memory cells connected to a third number of word lines in a third mode when the second refresh request signal is activated, and controlling the refresh circuit to perform the refresh operation to selected memory cells connected to a fourth number of word lines different from the third number of word lines in a fourth mode when the second refresh request signal is activated,
wherein the program circuit includes a first nonvolatile memory element,
wherein the first mode is selected when the first nonvolatile memory element is in a first state,
wherein the second mode is selected when the first nonvolatile memory element is in a second state, and
wherein the refresh request signal is activated, every time an external command is issued from outside the semiconductor memory device.

4. The semiconductor memory device as claimed in claim 3, wherein the second program circuit includes a second nonvolatile memory element,
wherein the third mode is selected when the second nonvolatile memory element is in a third state, and
wherein the fourth mode is selected when the second nonvolatile memory element is in a fourth state.

5. The semiconductor memory device as claimed in claim 3, wherein a duration of a refresh cycle in the third mode is greater than a duration of a refresh cycle in the fourth mode.

6. The semiconductor memory device as claimed in claim 4, wherein a state of the first nonvolatile memory element and a state of the second nonvolatile memory element are set independently from each other.

7. A semiconductor memory device, comprising:
a plurality of word lines;
a plurality of bit lines;
a plurality of memory cells each disposed at an associated intersection of the word liens and the bit lines;

a refresh circuit performing a refresh operation to refresh memory cells selected from said plurality of memory cells when a refresh request signal is activated; and a program circuit controlling the refresh circuit so as to perform the refresh operation to selected memory cells connected to a first number of word lines in a first mode every time the refresh request signal is activated and controlling the refresh circuit so as to perform the refresh operation to selected memory cells connected to a second number different from the first number of word lines in a second mode when the refresh request signal is activated. wherein a refresh cycle in the first mode is longer than a refresh cycle in the second mode.

8. The semiconductor memory device as claimed in claim 5, wherein a duration of the refresh cycle in the first mode is greater than a duration of the refresh cycle in the second mode and the refresh cycles in the first mode, second mode, and third mode are different from the refresh cycles in the fourth mode.

\* \* \* \* \*